United States Patent
Lin

(10) Patent No.: US 7,414,464 B2
(45) Date of Patent: Aug. 19, 2008

(54) OP DRIVER WITH THE FUNCTION OF CANCELING OP OFFSET

(75) Inventor: Kun-Tsung Lin, Tai Chung (TW)

(73) Assignee: Sunplus Technology Co., Ltd., Hsin-Chu (TW)

( * ) Notice: Subject to any disclaimer, the term of this patent is extended or adjusted under 35 U.S.C. 154(b) by 54 days.

(21) Appl. No.: 11/712,391

(22) Filed: Mar. 1, 2007

(65) Prior Publication Data
US 2007/0222506 A1    Sep. 27, 2007

(30) Foreign Application Priority Data
Mar. 24, 2006    (TW)    ............... 95110189 A

(51) Int. Cl.
*H03F 1/02*    (2006.01)
(52) U.S. Cl. .............. 330/9; 330/51; 330/260
(58) Field of Classification Search ............ 330/9, 330/51, 260
See application file for complete search history.

(56) References Cited

U.S. PATENT DOCUMENTS

| 6,111,467 A * | 8/2000 | Luo | 330/305 |
|---|---|---|---|
| 6,972,706 B2 * | 12/2005 | Snoeijs | 341/158 |
| 7,088,147 B2 * | 8/2006 | Prasad et al. | 327/91 |
| 7,245,321 B2 * | 7/2007 | Panicacci et al. | 348/241 |
| 7,268,814 B1 * | 9/2007 | Pain et al. | 348/294 |
| 7,348,824 B2 * | 3/2008 | Naviasky et al. | 327/307 |

\* cited by examiner

*Primary Examiner*—Patricia Nguyen
(74) *Attorney, Agent, or Firm*—Muncy, Geissler, Olds & Lowe, PLLC

(57)    ABSTRACT

An operational amplifier driver capable of canceling an offset voltage of an operational amplifier includes the operational amplifier, first to third switches and a capacitor. The operational amplifier has a chopper, first and second input terminals and an output terminal. The first switch receives an input voltage and is connected to the first input terminal. The second switch is connected to the first input terminal and the output terminal. The third switch is connected the second input terminal and the output terminal. The capacitor is connected to the second input terminal. Because the operational amplifier driver directly charges/discharges the capacitor through the output terminal, and the polarities of the first input terminal and the second input terminal may be changed, the operational amplifier driver can shorten a charge/discharge time of the capacitor and cancel the offset voltage without increasing a level of an input signal.

9 Claims, 5 Drawing Sheets

US 7,414,464 B2

OP DRIVER WITH THE FUNCTION OF CANCELING OP OFFSET

BACKGROUND OF THE INVENTION

This application claims the benefit of the filing date of Taiwan Application Ser. No 095110189, filed on Mar. 24 2006, the content of which is incorporated herein by reference.

1. Field of Invention

The invention relates to an operational amplifier driver and a method of canceling an offset voltage of an operational amplifier.

2. Related Art

An output voltage of a source driver from a typical thin film transistor liquid crystal display (TFT-LCD) is driven by an operational amplifier. Thus, an offset voltage of the operational amplifier influences the output voltage of the source driver. The offset voltage of the operational amplifier may vary due to the variation of the manufacturing processes so as to influence the color quality of the LCD. Thus, the problem of canceling the offset voltage has to be solved in the source driver.

FIG. 1A shows a conventional operational amplifier driver for canceling an offset voltage. Referring to FIG. 1A, the operational amplifier driver 10 includes three switches 11, 12 and 13, one capacitor 14 and one operational amplifier 15. An input signal Vin is inputted to the positive input terminal of the operational amplifier 15 through the switch 11. The input signal Vin is additionally inputted to the negative input terminal of the operational amplifier 15 through the switches 12 and 13. The capacitor 14 is connected to the positive input terminal of the operational amplifier 15 and a contact point between the switches 12 and 13. In addition, an output terminal of the operational amplifier 15 is connected to the negative input terminal for feedback. The operational amplifier driver 10 operates in two stages including an offset voltage sampling stage and an offset voltage holding stage.

FIG. 1B shows a switching state in the offset voltage sampling stage of the operational amplifier driver of FIG. 1A. FIG. 1C shows a switching state in the offset voltage holding stage of the operational amplifier driver of FIG. 1A. As shown in FIG. 1B, the switches 11 and 13 are turned on and the switch 12 is turned off in the offset voltage sampling stage. Thus, the offset voltage of the operational amplifier 15 is stored in the capacitor 14 across the two terminals of the capacitor 14. As shown in FIG. 1C, the switches 11 and 13 are turned off and the switch 12 is turned on in the offset voltage holding stage. Thus, the voltage stored in the capacitor 14 across the two terminals of the capacitor 14 is offset against the offset voltage of the operational amplifier 15 such that an output terminal voltage Vout of the operational amplifier 15 is equal to an input voltage Vin.

However, the above-mentioned technology needs the input voltage to directly charge the capacitor, so the level of the input signal has to be high enough. When the level of the input signal is not high enough, the effect of the above-mentioned technology is not ideal and thus influences the response speed.

SUMMARY OF THE INVENTION

It is therefore an object of the invention to provide an operational amplifier driver capable of canceling an offset voltage of an operational amplifier without directly charging a capacitor by an input signal.

To achieve the above-identified object, the invention provides an operational amplifier driver capable of canceling an offset voltage of an operational amplifier. The operational amplifier driver includes an operational amplifier, a first switch, a second switch, a third switch and a capacitor. The operational amplifier has a chopper, a first input terminal, a second input terminal and an output terminal. The first switch receives an input voltage and is connected to the first input terminal of the operational amplifier. The second switch is connected to the first input terminal of the operational amplifier and the output terminal of the operational amplifier. The third switch is connected to the second input terminal of the operational amplifier and the output terminal of the operational amplifier. The capacitor is connected to the second input terminal of the operational amplifier.

In an input voltage storing stage, the first switch and the third switch are turned on, the second switch is turned off, the first input terminal is switched to a positive input terminal and the second input terminal is switched to a negative input terminal. In a voltage outputting stage, the first switch and the third switch are turned off, the second switch is turned on, the first input terminal is switched to the negative input terminal and the second input terminal is switched to the positive input terminal.

Because the operational amplifier driver directly charges/discharges the capacitor through the output terminal of the operational amplifier, the level of the input signal needs not to be increased and the charge/discharge time of the capacitor can be shortened.

BRIEF DESCRIPTION OF THE DRAWINGS

FIGS. 5A and 5B are circuit diagrams showing an operational amplifier driver capable of canceling an offset voltage of an operational amplifier according to a second embodiment of the invention, wherein FIG. 5A shows a switching state of offset voltage sampling, and FIG. 5B shows a switching state of offset voltage holding.

DETAILED DESCRIPTION OF THE INVENTION

An operational amplifier driver capable of canceling an offset voltage of an operational amplifier will be described with reference to the accompanying drawings.

Figure 1A:
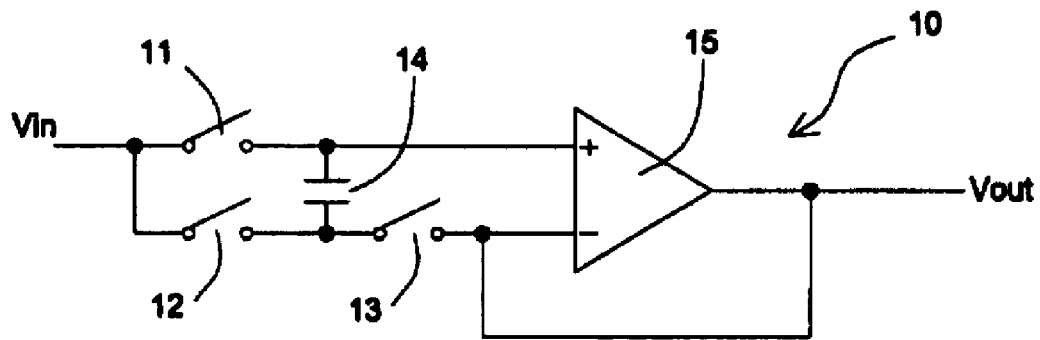
FIG. 1A shows an operational amplifier driver for canceling an offset voltage of a conventional operational amplifier.
Figure 1B:
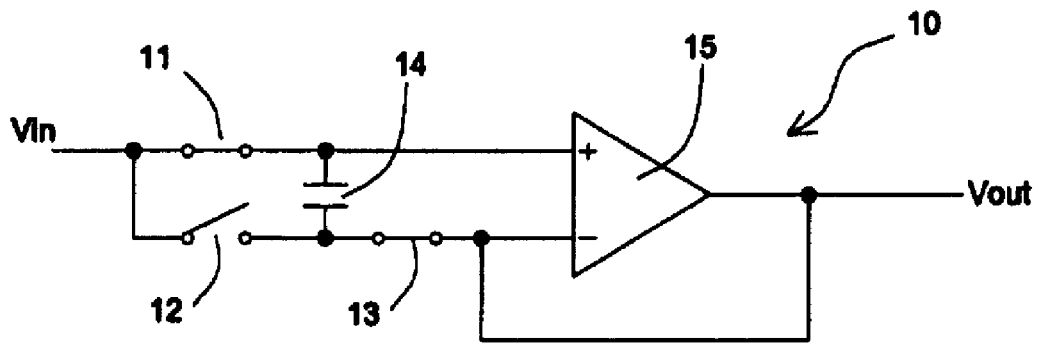
FIG. 1B shows a switching state in an offset voltage sampling stage of the operational amplifier driver of FIG. 1A.
Figure 1C:
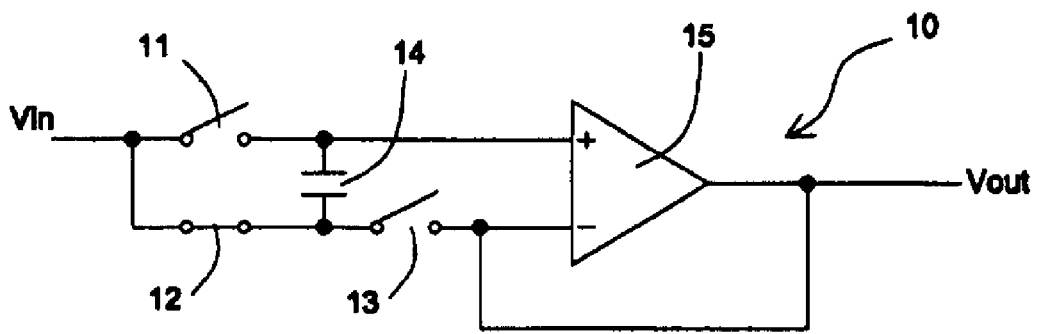
FIG. 1C shows a switching state in an offset voltage holding stage of the operational amplifier driver of FIG. 1A.
Figure 2A:
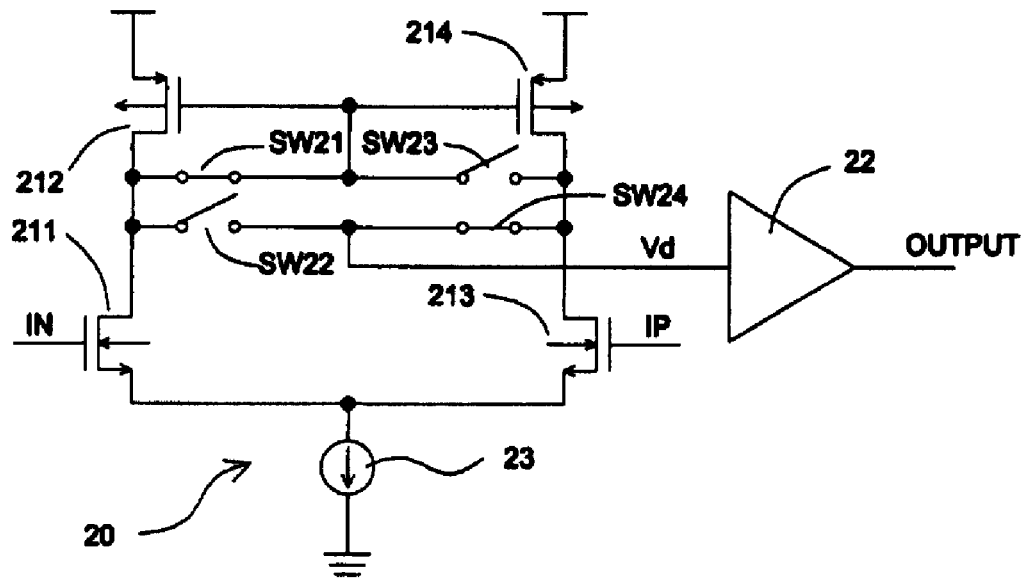
FIGS. 2A and 2B are circuit diagrams showing an operational amplifier having a chopper.
Figure 2B:
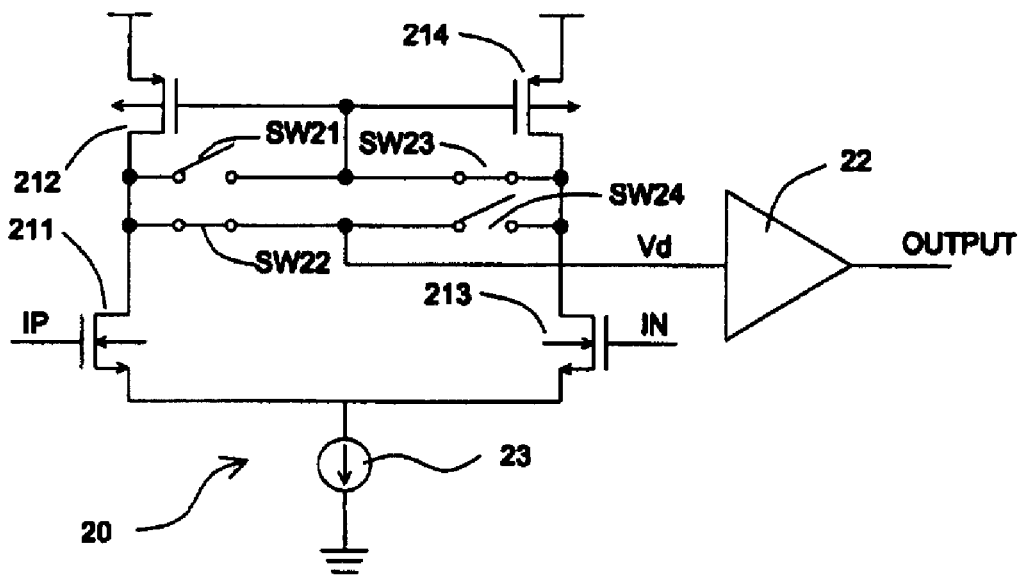

The pins of the positive input terminal and the negative input terminal of the typical operational amplifier are fixed and cannot be changed. However, the operational amplifier with the chopper can control the pins of the positive input terminal and the negative input terminal according to a switching signal. FIGS. 2A and 2B are circuit diagrams showing an operational amplifier 20 having a chopper. Referring to FIGS. 2A and 2B, the operational amplifier 20 with the chopper includes four transistors 211, 212, 213 and 214, one output gain stage 22 and one current source 23, which are also included in the typical operational amplifier. The operational amplifier 20 further includes four switches SW21, SW22, SW23 and SW24. The transistors 211 and 212 are cascaded together, and the transistors 213 and 214 are cascaded together. The gates of the transistors 212 and 214 are connected to each other and the sources of the transistors 211 and 213 are connected to each other and then grounded through the current source 23. The switch SW21 is connected to the gate and the drain of the transistor 212, and the switch SW23 is connected to the gate and the drain of the transistor 214. In addition, because the gates of the transistors 212 and 214 are connected to each other, one terminal of the switch SW21 and one terminal of the switch SW23 are also connected to each other. The drain of the transistor 212 is connected to the drain of the transistor 214 through the switches SW22 and SW24. The contact point between the switches SW22 and SW24 is connected to the input terminal of the output gain stage 22. The switches SW21, SW22, SW23 and SW24 may also be controlled to turn on according to the switching signal.

The gates of the transistors 213 and 211 are respectively defined as a first input terminal and a second input terminal. Thus, as shown in FIG. 2A, the first input terminal is the positive input terminal and the second input terminal is the negative input terminal in this state because the switches SW21 and SW24 are turned on and the switches SW22 and SW23 are turned off. In addition, as shown in FIG. 2B, the first input terminal is the negative input terminal and the second input terminal is the positive input terminal in this state because the switches SW21 and SW24 are turned off and the switches SW22 and SW23 are turned on.

Figure 3A:
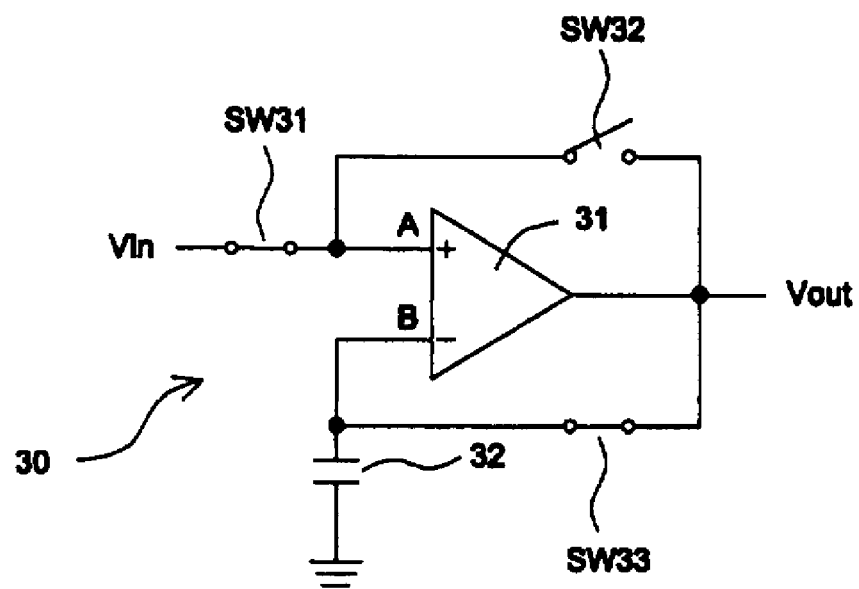
FIG. 3A is a circuit diagram showing an operational amplifier driver capable of canceling an offset voltage of an operational amplifier according to the invention, wherein the operational amplifier driver is in an input voltage storing stage.
Figure 3B:
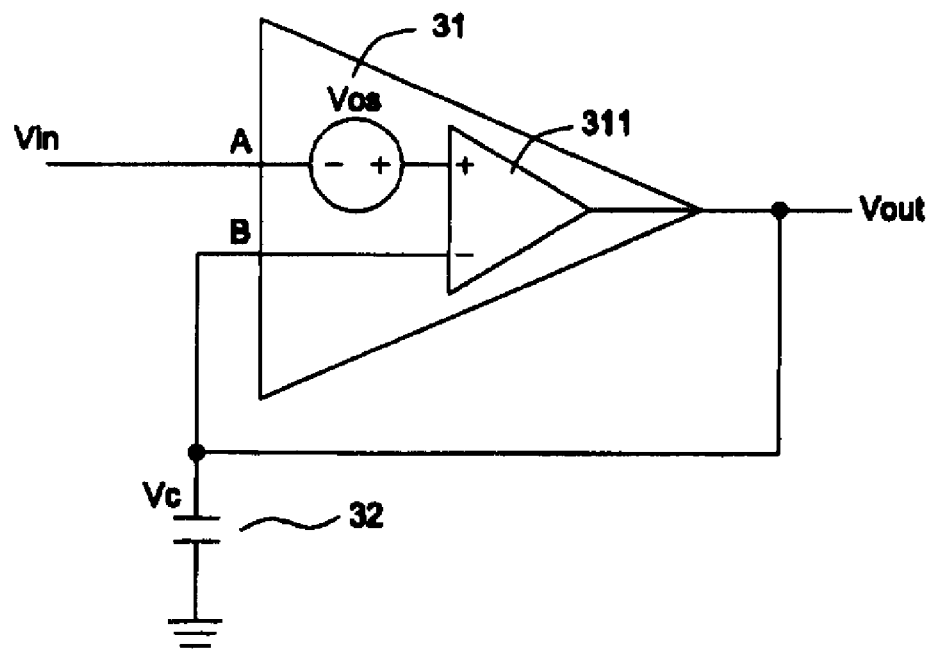
FIG. 3B is a simplified diagram showing the operational amplifier driver of FIG. 3A.
Figure 4A:
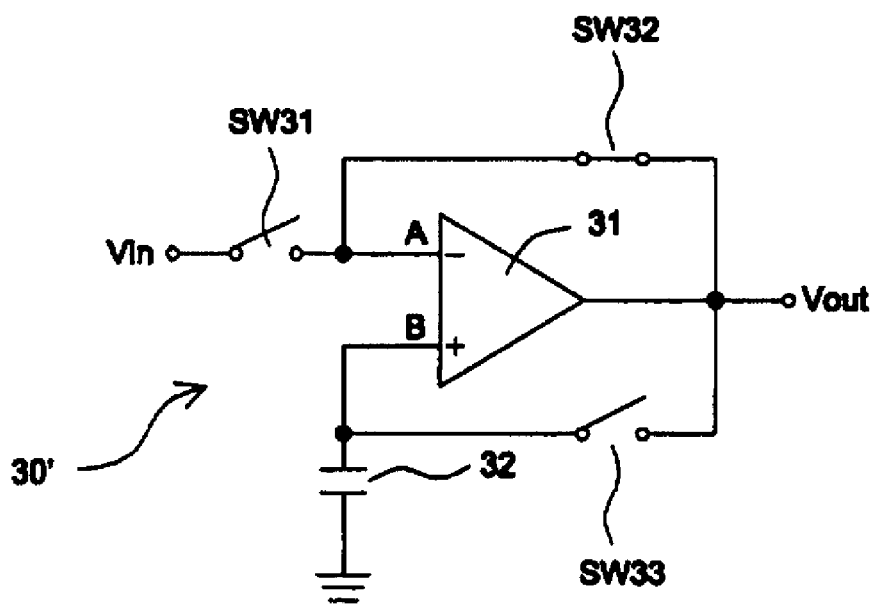
FIG. 4A is a circuit diagram showing an operational amplifier driver capable of canceling an offset voltage of an operational amplifier according to the invention, wherein the operational amplifier driver is in a voltage outputting stage.
Figure 4B:
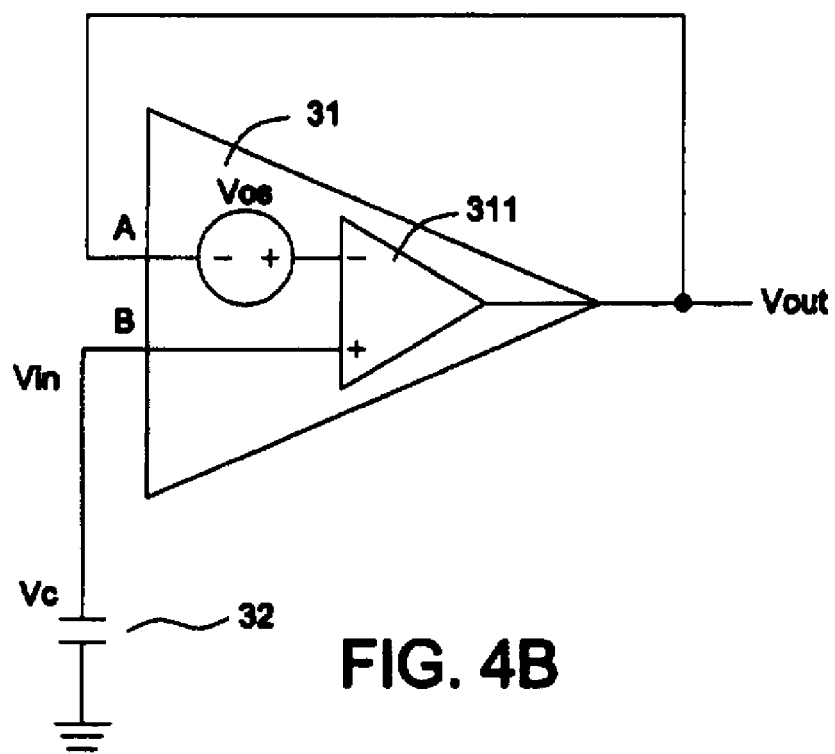
FIG. 4B is a simplified diagram showing the operational amplifier driver of FIG. 4A.

FIG. 3A is a circuit diagram showing an operational amplifier driver capable of canceling an offset voltage of an operational amplifier relating to a first embodiment of the invention, wherein the operational amplifier driver is in an input voltage storing stage. FIG. 3B is a simplified diagram showing the operational amplifier driver of FIG. 3A. FIG. 4A is a circuit diagram showing an operational amplifier driver capable of canceling an offset voltage of an operational amplifier according to the first embodiment of the invention, wherein the operational amplifier driver is in a voltage outputting stage. FIG. 4B is a simplified diagram showing the operational amplifier driver of FIG. 4A.

Referring to FIG. 3A, the operational amplifier driver 30 capable of canceling the offset voltage of the operational amplifier includes a first switch SW31, a second switch SW32, a third switch SW33, an operational amplifier 31 having a chopper, and a capacitor 32. The input voltage Vin is coupled to a first input terminal A of the operational amplifier 31 through the first switch SW31. An output terminal of the operational amplifier 31 is coupled to the first input terminal A through the second switch SW32 for feedback. The output terminal of the operational amplifier 31 is coupled to a second input terminal B through the third switch SW33 for feedback, and the second input terminal B is grounded through the capacitor 32. In addition, the first input terminal of the operational amplifier 31 is the positive input terminal and the second input terminal of the operational amplifier 31 is the negative input terminal in this input voltage storing stage.

So, the first input terminal (positive input terminal) of the operational amplifier 31 receives the input voltage Vin, and the second input terminal (negative input terminal) and the output terminal of the operational amplifier 31 are coupled to the capacitor 32, as shown in FIG. 3B. Thus, the capacitor 32 may be charged through the output terminal of the operational amplifier 31, and store the output voltage of the operational amplifier. Assume the offset voltage of the operational amplifier is a positive offset voltage in this case. In this case, the voltage Vc of the capacitor 32 is equal to the input voltage Vin plus the offset voltage Vos of the operational amplifier 31. The operational amplifier 31 is an ideal operational amplifier without the offset voltage.

$$Vc = Vin + Vos \qquad (1)$$

Next, the input voltage storing stage of the operational amplifier driver of FIG. 3A is switched to the voltage output stage of the operational amplifier driver of FIG. 4A. That is, the positive input terminal and the negative input terminal of the operational amplifier 31 are exchanged, and the offset voltage of the operational amplifier 31 is changed from the positive offset voltage to the negative offset voltage due to the exchange of the input terminals.

As shown in FIG. 4A, the elements of the operational amplifier driver 30' are the same as those of the operational amplifier driver 30 of FIG. 3A except that the first switch SW31 and the third switch SW33 are turned off and the second switch SW32 is turned on. Meanwhile, the first input terminal A of the operational amplifier 31 is the negative input terminal, and the second input terminal B of the operational amplifier 31 is the positive input terminal in the operational amplifier driver 30'.

Consequently, as shown in FIG. 4B, the output terminal of the operational amplifier 31 is coupled to the first input terminal (negative input terminal) for feedback and the second input terminal (positive input terminal) of the operational amplifier 31 receives the voltage of the capacitor 32 to serve as the input voltage Vin. So, the output voltage Vout is equal to the capacitor voltage Vc minus the offset voltage Vos.

$$Vout = Vc - Vos \qquad (2)$$

Substituting Equation (1) into Equation (2) can derive that the output voltage Vout is equal to the input voltage Vin.

$$Vout = Vin + Vos - Vos = Vin \qquad (3)$$

Therefore, the output voltage Vout generated in the voltage output stage is equal to the input voltage Vin without being influenced by the offset voltage Vos of the operational amplifier 31. So, the output voltage Vout also cannot be influenced even if the offset voltage of the operational amplifier varies due to the variation of the manufacturing process. In addition, because the voltage Vc stored in the capacitor 32 is directly driven through the output terminal of the operational amplifier 31 in the input voltage storing stage, the time of the input voltage storing stage can be shortened without increasing the level of the input signal. The operational amplifier driver capable of canceling the offset voltage of the operational amplifier according to the invention may also be applied to the source driver of the TFT-LCD or another device requiring the source driver.

Figure 5A:
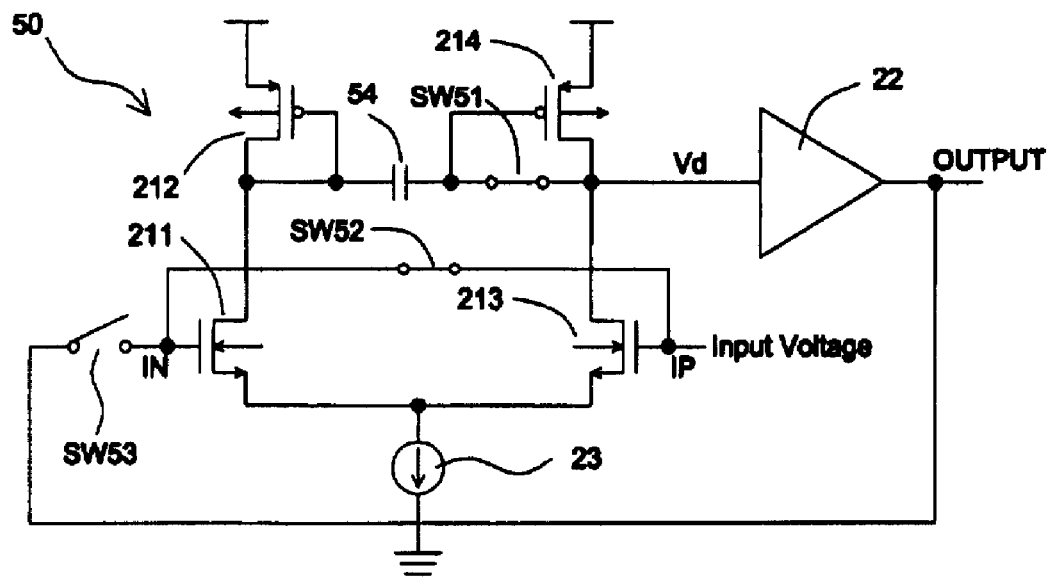
Figure 5B:
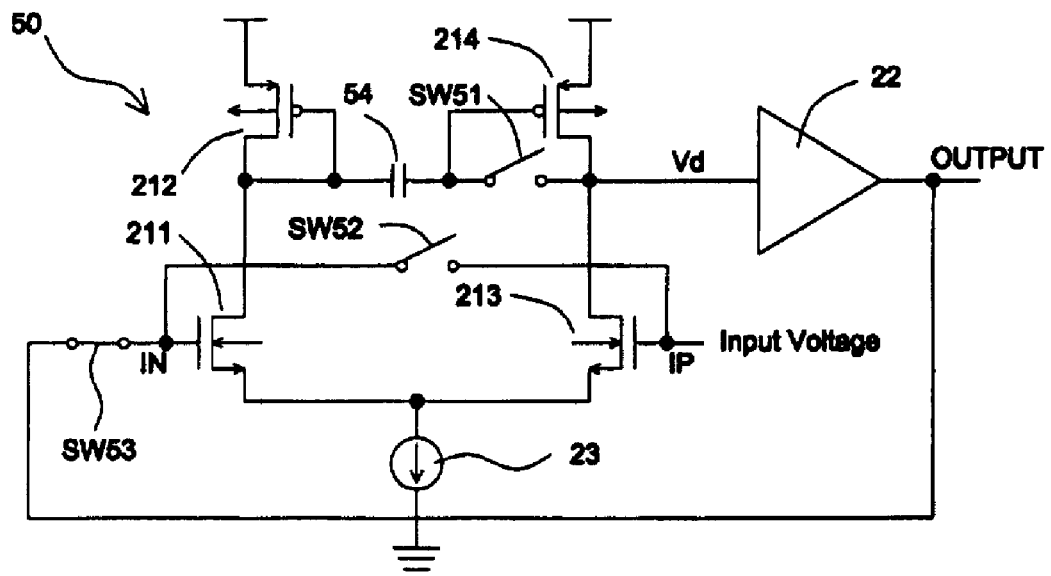

FIGS. 5A and 5B are circuit diagrams showing an operational amplifier driver capable of canceling an offset voltage of an operational amplifier according to a second embodiment of the invention, wherein FIG. 5A shows a switching state of offset voltage sampling, and FIG. 5B shows a switching state of offset voltage holding.

Referring to FIGS. 5A and 5B, the operational amplifier driver 50 capable of canceling the offset voltage of the operational amplifier includes four transistors 211, 212, 213 and

214, one output gain stage 22 and one current source 23, which are also included in the typical operational amplifier. The operational amplifier driver 50 further includes three switches SW51, SW52 and SW53 and one capacitor 54. The transistors 211 and 212 form a first current path, and the transistors 213 and 214 form a second current path. The first current path and the second current path form the architecture of a differential pair, and the gates of transistor 212 and the transistor 214 are connected to each other through the capacitor 54. The gate of the transistor 214 is connected to the drain of the transistor 214 through the switch SW51. The gate of the transistor 211 is connected to the gate of the transistor 214 through the switch SW52. The gate of the transistor 211 is connected to the output terminal of the output gain stage 22 through the switch SW53. In this embodiment, the transistors 212 and 214 are PMOS transistors and the transistors 211 and 213 are NMOS transistors.

The operational amplifier driver of FIG. 5A capable of canceling the offset voltage of the operational amplifier is in the switching state of offset voltage sampling. In this case, the switches SW51 and SW52 are turned on and the switch SW53 is turned off. So, the gates of the two PMOS transistors of the current mirror are connected together, the drains of the two PMOS transistors of the current mirror are connected together, and the two input terminals IP and IN of the operational amplifier are coupled to an input voltage in order to provide the input signals of two differential pairs, respectively. When no manufacturing factor exists, the currents of the two current paths are the same. However, when the manufacturing factor is added, the currents of the two current paths are slightly different from each other. In this case, the capacitor 54 is utilized to store a gate voltage difference between the PMOS transistors of two different current paths.

The operational amplifier driver of FIG. 5B capable of canceling the offset voltage of the operational amplifier is in the switching state of offset voltage holding. In this case, the switches SW51 and SW52 are turned off and the switch SW53 is turned on. At this moment, the operational amplifier returns to the connection of the normal operation. That is, the input terminal IN is coupled to the voltage feedback end of the output terminal of the operational amplifier. One capacitor is added between the gates of the PMOS transistors 212 and 214 on the current path. This capacitor stores the slight voltage difference between the two current paths. The capacitor 54 enables the two current paths to respectively provide the required currents and thus can eliminate the output voltage drift caused by the manufacturing process variation.

So, as shown in FIGS. 5A and 5B, the input terminal voltage signal does not have to directly force the capacitor 54 to charge/discharge, and the offset voltage caused by the manufacturing process variation can be cancelled by changing the current of the current mirror.

While certain exemplary embodiments have been described and shown in the accompanying drawings, it is to be understood that such embodiments are merely illustrative of and not restrictive on the broad invention, and that this invention not be limited to the specific construction and arrangement shown and described, since various other modifications may occur to those ordinarily skilled in the art.

What is claimed is:

1. An operational amplifier driver capable of canceling an offset voltage of an operational amplifier, the operational amplifier having a chopper, a first input terminal, a second input terminal and an output terminal, the operational amplifier driver comprising:

a first switch having a first terminal and a second terminal, wherein the first terminal receives an input voltage and the second terminal is connected to the first input terminal of the operational amplifier;

a second switch connected to the first input terminal of the operational amplifier and the output terminal of the operational amplifier;

a third switch connected to the second input terminal of the operational amplifier and the output terminal of the operational amplifier; and a capacitor connected to the second input terminal of the operational amplifier;

wherein:

in an input voltage storing stage, the first switch and the third switch are turned on, the second switch is turned off, the first input terminal is switched to a positive input terminal, and the second input terminal is switched to a negative input terminal; and in a voltage outputting stage, the first switch and the third switch are turned off, the second switch is turned on, the first input terminal is switched to the negative input terminal, and the second input terminal is switched to the positive input terminal.

2. The operational amplifier driver according to claim 1, wherein the first input terminal and the second input terminal of the operational amplifier having the chopper are switched between the positive input terminal and the negative input terminal according to a control signal.

3. The operational amplifier driver according to claim 1 being applied to a source driver of a thin film transistor liquid crystal display.

4. An operational amplifier driver for canceling an offset voltage of an operational amplifier, the driver comprising:

a first transistor, having a gate connected to a drain of the first transistor;

a second transistor, having a drain connected to the drain of the first transistor to form a first current path, wherein a gate of the second transistor is defined as a first input terminal;

a first switch;

a third transistor, having a gate connected to a drain of the third transistor through the first switch;

a fourth transistor, having a drain connected to the drain of the third transistor to form a second current path, wherein a differential voltage is generated at the drain of the fourth transistor, a gate of the fourth transistor is defined as a second input terminal, and a source of the fourth transistor is connected to a source of the second transistor;

a capacitor, connected between the gates of the first transistor and the third transistor;

an output gain stage, for receiving the differential voltage and generating an output voltage;

a second switch connected between the first input terminal and the second input terminal; and a third switch connected between the first input terminal and an output terminal of the output gain stage;

wherein:

in an offset voltage storing stage, the first switch and the second switch are turned on and the third switch is turned off so as to store the offset voltage into the capacitor; and in a voltage outputting stage, the first switch and the second switch are turned off and the third switch is turned on so as to output a signal through the output gain stage.

5. The operational amplifier driver according to claim 4, further comprising a current source connected to the source of the second transistor and the source of the fourth transistor.

6. The operational amplifier driver according to claim 4, wherein the first input terminal is a negative input terminal.

7. The operational amplifier driver according to claim 6, wherein the second input terminal is a positive input terminal.

8. The operational amplifier driver according to claim 4, wherein the first transistor and the third transistor are PMOS transistors.

9. The operational amplifier driver according to claim 8, wherein the second transistor and the fourth transistor are NMOS transistors.

* * * * *